United States Patent
Xu et al.

(10) Patent No.: US 10,539,836 B2
(45) Date of Patent: Jan. 21, 2020

(54) DISPLAY SUBSTRATE, METHOD OF FABRICATING THE SAME, AND DISPLAY DEVICE

(71) Applicants: BOE Technology Group Co., Ltd., Beijing (CN); Hefei BOE Optoelectronics Technology Co., Ltd., Anhui (CN)

(72) Inventors: Guohua Xu, Beijing (CN); Ling Hu, Beijing (CN); Peng Zeng, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 184 days.

(21) Appl. No.: 15/220,111

(22) Filed: Jul. 26, 2016

(65) Prior Publication Data

US 2017/0090233 A1    Mar. 30, 2017

(30) Foreign Application Priority Data

Sep. 30, 2015    (CN) .......................... 2015 1 0642296

(51) Int. Cl.
| | | |
|---|---|---|
| *G02F 1/1333* | (2006.01) | |
| *G02F 1/1368* | (2006.01) | |
| *G02F 1/1339* | (2006.01) | |
| *G02F 1/1335* | (2006.01) | |
| *G02F 1/1337* | (2006.01) | |
| *G02F 1/1343* | (2006.01) | |

(Continued)

(52) U.S. Cl.
CPC ........ *G02F 1/13394* (2013.01); *G02F 1/1337* (2013.01); *G02F 1/1368* (2013.01); *G02F 1/13439* (2013.01); *G02F 1/133514* (2013.01); *G02F 1/134309* (2013.01); *G02F 1/136286* (2013.01); *H01L 27/124* (2013.01); *H01L 27/1288* (2013.01); *G02F 2001/13398* (2013.01); *G02F 2201/121* (2013.01); *G02F 2201/123* (2013.01)

(58) Field of Classification Search
CPC .................................................. G02F 1/13394
See application file for complete search history.

(56) References Cited

U.S. PATENT DOCUMENTS

| | | | |
|---|---|---|---|
| 2002/0039166 A1 | 4/2002 | Song | |
| 2007/0222934 A1* | 9/2007 | Huang | ................ G02F 1/13394 349/155 |

(Continued)

FOREIGN PATENT DOCUMENTS

| | | |
|---|---|---|
| CN | 101071220 A | 11/2007 |
| CN | 101373298 A | 2/2009 |

(Continued)

OTHER PUBLICATIONS

Sep. 27, 2017—(CN) First Office Action Appn 201510642296.1 with English Tran.

*Primary Examiner* — Steven H Loke
*Assistant Examiner* — Scott Stowe
(74) *Attorney, Agent, or Firm* — Banner & Witcoff, Ltd.

(57) ABSTRACT

A display substrate, a method of fabricating the same and a display device are provided. The display substrate includes a substrate and a groove formed on the substrate. The groove is formed by photoresist and the bottom surface of the groove exceeds a height of a pixel area.

15 Claims, 6 Drawing Sheets

(51) Int. Cl.
    *G02F 1/1362*     (2006.01)
    *H01L 27/12*     (2006.01)

(56) References Cited

U.S. PATENT DOCUMENTS

| | | | |
|---|---|---|---|
| 2009/0046227 A1* | 2/2009 | Fan Jiang | G02F 1/133555 349/114 |
| 2009/0275256 A1 | 11/2009 | Lee et al. | |
| 2013/0335691 A1 | 12/2013 | Wu et al. | |
| 2016/0133653 A1* | 5/2016 | Kim | G02F 1/133345 257/66 |
| 2016/0370627 A1* | 12/2016 | Tang | G02F 1/13394 |
| 2017/0097532 A1* | 4/2017 | Tang | G02F 1/13394 |

FOREIGN PATENT DOCUMENTS

| | | |
|---|---|---|
| CN | 1940646 B | 5/2010 |
| CN | 102736311 A | 10/2012 |
| CN | 102955297 A | 3/2013 |

\* cited by examiner

DISPLAY SUBSTRATE, METHOD OF FABRICATING THE SAME, AND DISPLAY DEVICE

This application claims priority to and the benefit of Chinese Patent Application No. 201510642296.1 filed on Sep. 30, 2015, which application is incorporated herein in its entirety.

TECHNICAL FIELD

Embodiments of the present disclosure relate to a display substrate, a method of fabricating the same and a display device.

BACKGROUND

A liquid crystal display device, due to advantages such as no radiation, low power consumption, less thermal dissipation, small size, accurate image restoration, as well as sharp character of image display, is widely used to replace traditional CRT display device.

SUMMARY

Embodiments of the present disclosure provide a display substrate, a method of fabricating the same and a display device.

According to at least one embodiment of the present disclosure, a display substrate is provided, including a substrate and a groove formed on the substrate. The groove is formed via photoresist and a bottom surface of the groove exceeds a height of a pixel area on the substrate.

In an example, the groove is formed by photoresist used in a last photolithography process in a fabrication process of the display substrate.

In an example, the substrate is an array substrate and the groove is provided above a top transparent conductive layer of the array substrate, and configured to receive a spacer formed on an opposite substrate.

In an example, the substrate is a color filter substrate and the groove is provided above a top color filter layer, and configured to receive a spacer formed on the substrate.

In an example, the spacer includes kinds of spacers and the groove at least corresponds to at least one kind of the spacers.

In an example, the spacer includes a main spacer configured to sustain cell gap and the groove includes a first groove that corresponds to the main spacer.

In an example, the first groove is provided on a distribution area of gate lines on the array substrate and the first groove is provided with a spacer block therein.

In an example, the spacer further includes an secondary spacer and the groove includes a second groove that corresponds to the secondary spacer.

In an example, the second groove is provided on a distribution area of gate lines or a corresponding area of a thin film transistor on the array substrate.

In an example, the main spacer has a height equal to that of the secondary spacer and the first groove has a depth less than that of the second groove; or, the main spacer has a height greater than that of the secondary spacer and the first groove has a depth equal to that of the second groove.

In an example, each spacer is a columnar structure with a wide upper part and a narrow lower part and the groove that corresponds to the spacer is a structure with a wide upper part and a narrow lower part.

According to at least one embodiment of the present disclosure, a display device is also provided, including the display substrate.

In an example, the display substrate is an array substrate.

In an example, the display device further includes an opposite substrate that is disposed opposite to the array substrate and the opposite substrate is provided with a spacer that corresponds to the groove, the spacer being configured to be received in the groove in a cell-assembling process.

According to at least one embodiment of the present disclosure, a method of fabricating a display substrate is further provided, including: forming a groove on the substrate by photoresist used in a photolithography process. A bottom surface of the groove exceeds a height of a pixel area on the display substrate.

In an example, forming of the groove on the substrate by photoresist used in the photolithography process includes: in a last photolithography process of the display substrate, forming the groove synchronously by the photoresist used in the photolithography process.

In an example, the display substrate is an array substrate, and in a last photolithography process of the array substrate for forming a transparent electrode, the groove is formed synchronously by the photoresist via a half-tone mask process and an ashing process, the groove being configured to correspond to a spacer formed on an opposite substrate and to receive the spacer in a cell-assembling process.

In an example, after the groove is formed, performing a curing process for the groove.

BRIEF DESCRIPTION OF THE DRAWINGS

Embodiments of the present disclosure will be described in more detail as below in conjunction with the accompanying drawings to enable those skilled in the art to understand the present disclosure more clearly, in which.

DETAILED DESCRIPTION

Technical solutions according to the embodiments of the present disclosure will be described clearly and understandable as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
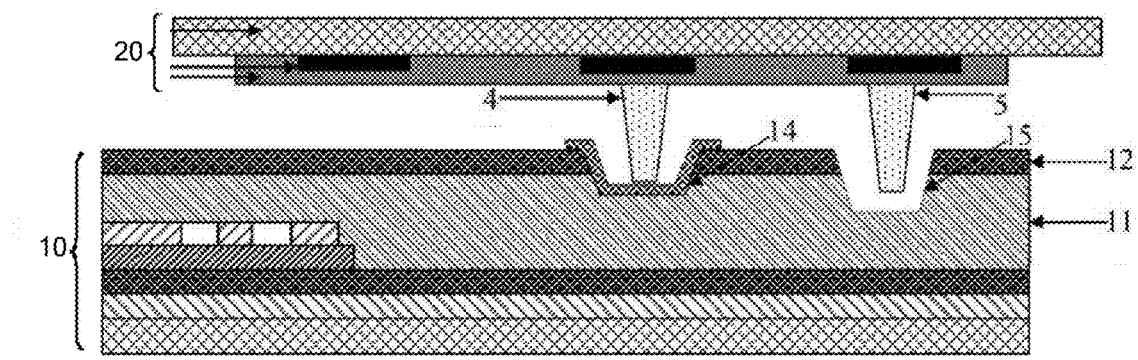
FIG. 1 is a cross sectional view schematically showing structures of a liquid crystal display.

A liquid crystal display device mainly includes an opposite substrate (e.g., a color filter substrate), an array substrate and liquid crystals disposed between the two substrates. To sustain cell gap between the opposite substrate and the array substrate in the liquid crystal display device, spacers are usually provided. As illustrated in FIG. 1, columnar main spacers 4 and secondary spacers 5 are provided on an opposite substrate 20 of a liquid crystal display device, and first grooves 14 and second grooves 15 that correspond to the main spacers and the secondary spacers are formed on an array substrate 10, so as to prevent glide between the two substrates, and avoid occurrence of defects, such as light leakage and color unevenness. In this way, forming the grooves (the first grooves 14 and the second grooves 15) requires an extra photolithography process (including processes, such as plating, exposure, development and ashing of the organic film) of an organic film 11 and a protection film 12, which increases manufacturing cost and process time. In addition, the height of the groove position is less than that of a pixel area, and once relatively strong external force is applied, the spacers may easily glide out of the grooves and scratch an alignment film that is provided on the array substrate side, which can cause partially abnormal alignment that leads to abnormal display (such as push mura).

Figure 2:
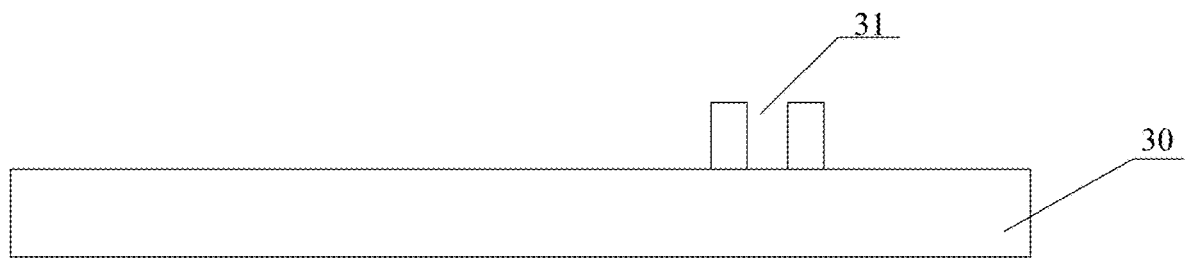
FIG. 2 is a cross sectional view schematically showing structures of a display substrate with grooves formed thereon in an embodiment of the present disclosure, illustrating.

An embodiment of the present disclosure provides a display substrate, including a substrate 30 and a pixel area. As illustrated in FIG. 2, grooves 31 are also provided on the display substrate. The grooves 31 correspond to spacers that are disposed on an opposite substrate or disposed additionally and are configured to receive the spacers. The groove 31 is formed by photoresist and a bottom surface of the groove 31 exceeds a height of a pixel area on the display substrate.

The display substrate, provided in the embodiment, is provided with grooves 31 that correspond to spacers and the spacers are disposed on another substrate that is cell-assembled with the display substrate 30 or the spacers are disposed independent of the substrate. After cell-assembling, the spacers are fit into the grooves 31, which can effectively avoid adverse effect due to occurrence of glide between the two substrates. In addition, the bottom surface of the groove 31 exceeds a height of a pixel area on the display substrate. Due to the height of the grooves 31, even if relative strong external force is applied to cause the spacers to glide out of the grooves 31, this will not seriously scratch an alignment film, so that partial abnormal alignment is avoided. The grooves 31 can be formed by photoresist, For example, for photoresist used in a certain process in a fabrication process of the display substrate, the photoresist used in a photolithography process can be reserved for forming the above grooves. For example, the groove patterns on positions correspond to the spacers can be fabricated synchronously in an exposure process in the above photolithography process and the above groove patterns are etched in an etching process in the above photolithography process, so as to form the grooves 31 that correspond to the spacers without extra process. It needs to pay attention to that, other film layers that are additionally reserved due to existence of photoresist at positions of the grooves 31 shall not influence the display substrate during the process is implemented.

For a liquid crystal display device, the display substrate can be a color filter substrate or an array substrate. For an OLED (organic light-emitting diode) display device, the display substrate can be an OLED back plate or a protection substrate that is cell-assembled with the OLED back plate. So the embodiments of the present disclosure are not limited to display substrates, and may also be any case that spacers are needed to be disposed to sustain cell gap of a display substrate.

For example, grooves 31 are formed by photoresist used in a last photolithography process in a fabrication process of a display substrate, which can avoid insufficient depth and width of the grooves 31 due to too many film layers overlapped above there to accommodate spacers. For an array substrate of a TN (Twist Nematic) type, if a last photolithography process is a process to form a passivation layer, grooves 31 can be formed synchronously with formation of via holes of the passivation layer. For an array substrate of an ADS (Advanced-Super Dimensional Switching) type, if a last photolithography process is a process to form a second layer of a transparent conductive layer, grooves 31 can be formed synchronously with forming a transparent electrode of the top layer (a second transparent electrode, pixel electrodes or common electrodes), that is, the grooves 31 are provided above the top transparent conductive layer of the array substrate, and a formation method will be described later in detail.

Because spacers can be of multiple kinds, correspondingly, a groove(s) 31 can be designed with a structure that at least corresponds to at least one or all of spacers of one kind. For example, if spacers include main spacers and secondary spacers that are used to sustain cell gap. Under a normal condition, the secondary spacers will not abut on a display substrate and function merely under a condition that external force is strong or the main spacers become invalid. Therefore, correspondingly, the grooves 31 can include a first groove that corresponds to at least one or all the main spacers and a second groove that corresponds to at least one of or all the secondary spacers. The grooves can correspond to a part of the main spacers and a part of the secondary spacers. The grooves can be arranged in a uniform way or a non-uniform way. The grooves being disposed can fix spacers to allow a substrate not gliding, however, embodiments of the present disclosure are not limited thereto. As optional embodiments, height of the main spacer can be equal to that of the secondary spacer, and the depth of the first groove is less than that of the second groove; or, it can be a case that the height of the main spacer is greater than that of the secondary spacer and the depth of the first groove is equal to that of the second groove; or, it may be a case that the height of the main spacer is equal to that of the secondary spacer and the depth of the first groove is equal to that of the second groove, while a spacer block is placed in the first groove for elevating the bottom of the grooves, so that when the main spacer is abutted on the spacer block, the secondary spacer will not abut a display panel. But embodiments of the present disclosure are not limited thereto.

Figure 3:
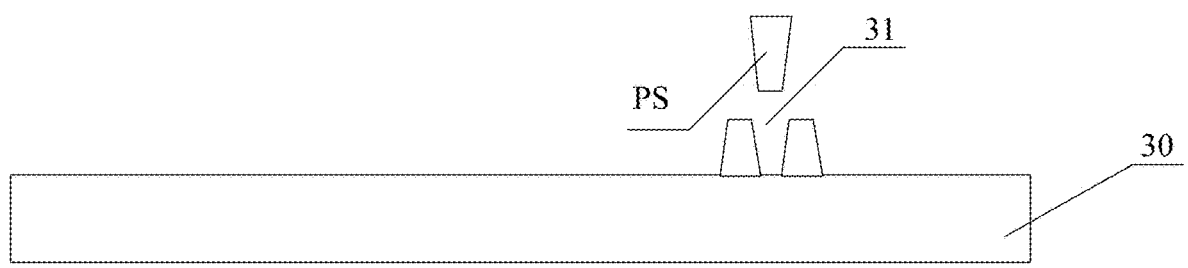
FIG. 3 is a cross sectional view schematically showing structures of a display substrate with a groove formed thereon with a wide upper part and a narrow lower part in an embodiment of the present disclosure.
Figure 4:
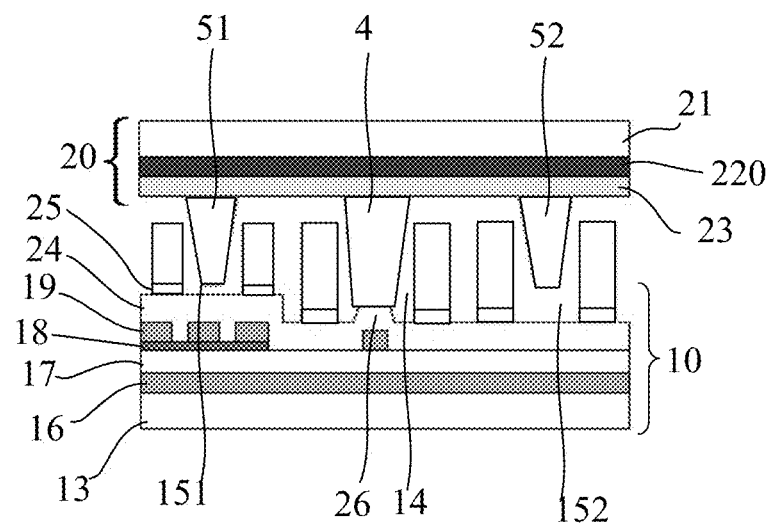
FIG. 4 is a cross sectional view schematically showing structures of an ADS array substrate and a color filter substrate in an embodiment of the present disclosure.

For example, referring to FIG. 3 in conjunction with FIG. 4, the above spacers (including main spacers and secondary spacers) are formed in a columnar structure with a wide upper part and a narrow lower part. If the spacer is assembled in a groove 31, a gap exists between the spacer and the groove 31. In use, a gap between a columnar main spacer 4 and a first groove as well as a gap between columnar secondary spacers 51, 52 and a second groove can resist external pressure to sustain cell gap. In addition, the columnar main spacer 4 is cooperated with the first groove and the columnar secondary spacers 51, 52 are cooperated with the second grooves, which can prevent glide between an upper substrate and a lower substrate. Optionally, the first groove is located on a distribution area of gate lines on an array substrate and the second groove is located on a distribution area of gate lines and corresponding areas of thin film transistors on the array substrate. It is noted that, the structure with the wide upper part and the narrow lower part of the spacer refers to a case that an end of the spacer close to the substrate it locates thereon is the upper end and another end is the lower end, that is, in a direction from the end close to the substrate to the end away from the substrate on which the spacer locates, the size of the spacer gradually decreases. In this way, the configuration is easily realizable technically and is more stable.

For example, further, a groove 31 that corresponds to an above spacer is of a structure with a wide upper part and a narrow lower part allows the columnar main spacer being more easily embedded into the corresponding groove 31 in a cell-assembling process. It is noted that the structure with the wide upper part and narrow lower part of the groove refers to a case that an end at the bottom of the groove is a lower end and an end at the top of the groove is an upper end, that is, in a direction from the bottom end to the top end, the opening of the groove is gradually enlarged. The spacer and the groove form a relatively nested structure, with the shape of the opening of the groove being configured to match with that of the spacer, so as to allow them being cooperated with each other better to avoid gliding of the substrates.

An embodiment of the present disclosure further provides a display device, which includes any one of the display substrate above. Due to the above photoresist grooves provided in the display device corresponding to the spacers and the bottom surface of the grooves being exceeding the height of the pixel area on the display substrate, it can avoid a problem of spacers easily glide out of grooves to result in a display defect, and this will not add an extra process. The display device can be any product or component having display function, such as a liquid crystal panel, an electronic paper, an OLED panel, a cell phone, a tablet computer, a TV set, a display, a laptop computer, a digital photo frame or a navigator.

An embodiment of the present invention further provides a method of fabricating a display substrate, including forming a groove by photoresist used in a photolithography process. A bottom surface of the groove exceeds a height of a pixel area on the display substrate. It can avoid a problem of spacers easily glide out of grooves to result in a display defect, and this will not add an extra process.

Optionally, in a last photolithography process of the display substrate, grooves that correspond to spacers can be formed synchronously by photoresist used in the photolithography process. If the display substrate is an array substrate, and in the last photolithography process of the array substrate for forming a transparent electrode, grooves that correspond to spacers are formed synchronously via photoresist by a half-tone mask process and an ashing process. Further, the method includes curing the grooves after the grooves are formed.

To allow an ordinary skill in the art to better understand the structure of the display substrate provided in the embodiments of the present disclosure, an ADS array is taken as an example hereinafter to describe the technical solutions provided in the embodiments of the present disclosure in detail.

In the advanced ultra-dimensional field switching technology, a multi-dimensional electric field is formed via a parallel electric field produced by edges of pixel electrodes or common electrodes on a same plane and a longitudinal electric field generated between the pixel electrode and the common electrode, so as to allow all liquid crystal molecules in various directions disposed between the pixel electrodes and the common electrodes, and those disposed right above the pixel electrodes or the common electrodes in a liquid crystal cell, to rotate. Thus work efficiency of liquid crystals of the plane alignment system and light transmittance are increased. Advanced ultra-dimensional field switching technology can improve image quality of TFT-LCD and has advantages, such as high transmittance, wide viewing angle, high aperture ratio, low color difference, low response time and no push Mura.

As shown in FIG. 4, an ADS display device includes an array substrate 10 and a color filter substrate 20 that are cell-assembled with each other. The color filter substrate 20 includes a substrate 21, a color filter layer 220 and a planarization layer (OC layer) 23. The color filter layer includes a black matrix (BM) and a color resist. A main spacer 4, a secondary spacer 51 and a secondary spacer 52 of cylinder-like are provided on planarization layer 23. The Main spacer 4 corresponds to a distribution area of gate lines on the array substrate. The height of main spacer 4 is greater than that of the secondary spacer 51 and the secondary spacer 52. The secondary spacer 51 and the secondary spacer 52 are different in their positions located on the substrate. For example, the secondary spacer 51 and the secondary spacer 52 correspond to a distribution area of gate lines and corresponding areas of a thin film transistor on the array substrate, respectively.

Figure 5:
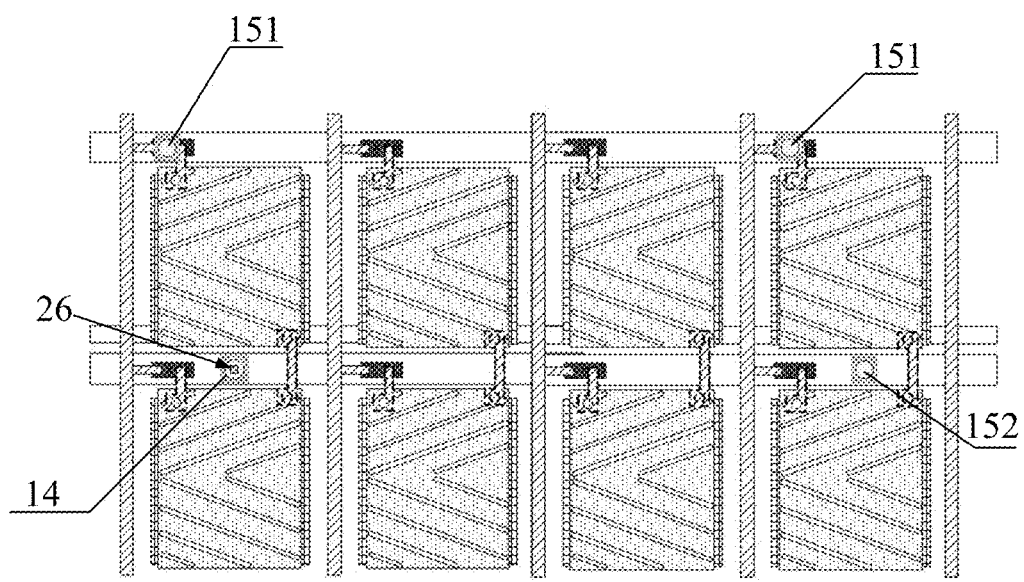
FIG. 5 is a design plan view of grooves on an ADS array substrate in an embodiment of the present disclosure.

As shown in FIG. 4 and FIG. 5, the array substrate 10 may include in an order from the bottom to the top: a substrate 13, a first transparent conductive layer (not shown), a gate metal layer 16, a gate insulating layer 17, an active layer 18, a source-drain metal layer 19, a passivation layer 24 and a second transparent conducting layer 25. The second transparent conductive layer 25 is provided with grooves formed by photoresist. The grooves include a first groove 14 that corresponds to a main spacer 4, the first groove 14 being provided on a distribution area of gate lines on the array substrate, second grooves 151 and 152 that correspond to the secondary spacer 51 and the secondary spacer 52, the second groove 151 being provided on the distribution area of gate lines and the second groove 152 being provided on a corresponding area of the thin film transistor. The height of the main spacer 4 is greater than the height of the secondary spacer 51 and the secondary spacer 52, and a spacer block 26 formed by the passivation layer 20 are provided in the first groove 14 that corresponds to the main spacer 4, while the second groove 151 is provided on the area above the thin film transistor of the array substrate, and the bottom of the second groove 151 is relatively high, so that spacers of three levels are eventually formed. This design is suitable for an ADS product with large size and can improve unevenness of images in dark state, for example.

On the basis of three-level spacer (PS) design, the embodiment further provides the grooves formed via photoresist on a position corresponding to the spacers on the array substrate. The photoresist is modified and hardened via heat treatment. After the array substrate is cell-assembled with a color filter substrate, the spacers are positioned in the corresponding grooves and a gap exists between the spacers and side wall of the grooves, which can effectively prevent gliding between the two substrates to avoid defects, such as light leakage, touch mura, uneven color and PS mura. Light leakage is mainly caused by a case that a black matrix can not block a corresponding non-pixel area due to relative gliding between the array substrate and the opposite substrate; Touch mura is generated mainly due to a case that light leakage of an liquid crystal screen, after being slapped, cannot be restored in time; Color unevenness is a defect that is mainly caused by cell gap difference and color difference, which are generated by height difference caused by change of positions of the spacer with respect to the array substrate after the relative gliding between the array substrate and the opposite substrate occurs; PS mura is a display defect (mura) mainly caused by partial abnormal alignment, which is generated by scratching of alignment film on the array substrate side by the spacer after the relative gliding between the array substrate and the counter substrate occurs.

The above grooves can be formed via photoresist retained in a photolithography process of an array substrate. The height of the photoresist retained is less than that of the spacer and seal agent, so that cell-assembling two substrates will not be impacted. The photoresist groove structure, provided in the embodiment of the present disclosure, can be formed during the mask (2nd ITO mask) process of the second transparent conductive layer, without an extra exposure process, and is also applicable to liquid crystal products of other modes, such as a TN mode, which is of high practicality and can effectively improve product quality.

Figure 6A:
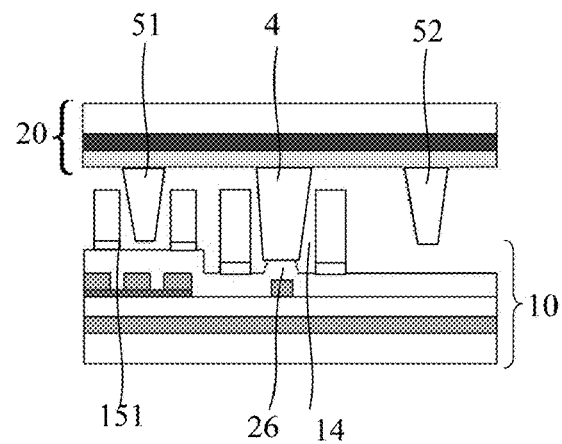
FIG. 6(a) to FIG. 6(c) are cross sectional views schematically showing structures of another three kinds of spacers and positions of grooves in embodiments of the present disclosure.
Figure 6B:
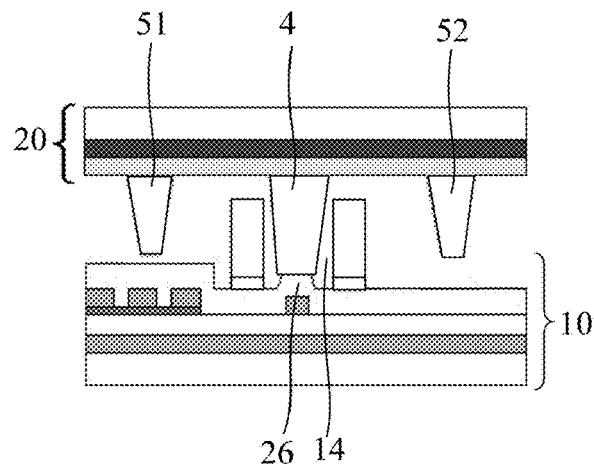
Figure 6C:
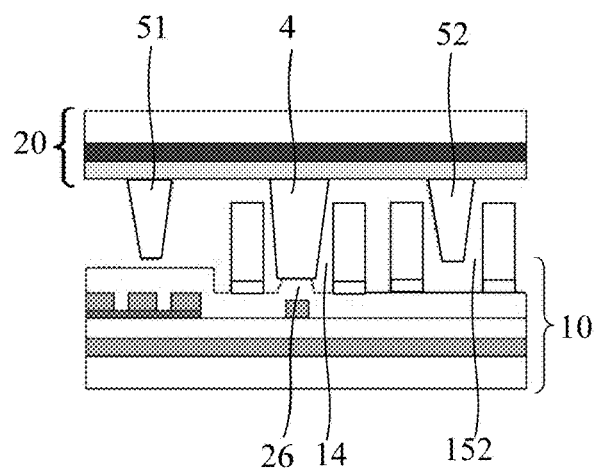

For the above array substrate, in a process of fabricating the second transparent conductive layer: a half-tone mask process (HTM, Half Tone Mask) or a single slit mask process (SSM, Single Slit Mask) is used to form the transparent conductive layer and retain a pattern that corresponds to the photoresist. Retaining photoresist to form grooves includes four types: a first kind, as shown in FIG. 4, photoresist grooves are retained on positions that main spacers 4 and secondary spacers 51 and 52 correspond to on the array substrate, namely the first groove 14 and the second grooves 151, 152 are formed on the array substrate; a second kind, as shown in FIG. 6(*a*), the photoresist grooves are formed on positions that the main spacer 4 and the secondary spacer 51 correspond to on array substrate, namely the first groove 14 and the second groove 151 are formed on the array substrate; a third kind, as shown in FIG. 6(*b*), the photoresist groove is formed on a position that merely the main spacer 4 corresponds to on array substrate, namely merely the first groove 14 is formed on the array substrate; a fourth kind, as shown in FIG. 6 (*c*), the photoresist grooves are formed on positions that the main spacer 4 and secondary spacer 52 correspond to on array substrate, namely the first groove 14 and the second groove 152 are formed on the array substrate. In addition, gaps are left between the above spacers and the grooves of the array substrate, namely the size of the groove is slightly larger than the maximum size at the top of the spacer. The meaning of "size" herein is related to the cross-section of the spacer. If the cross section of the spacer is a rectangle, the "size" here is understood as length and width of the rectangle. If the cross section of the spacer is a circle, the "size" here is understood as the diameter of the circle.

It is readily understandable that main spacers and secondary spacers can be formed on a substrate (such as a color filter substrate) that is provided opposite to the array substrate, or be formed separately.

Figure 7:
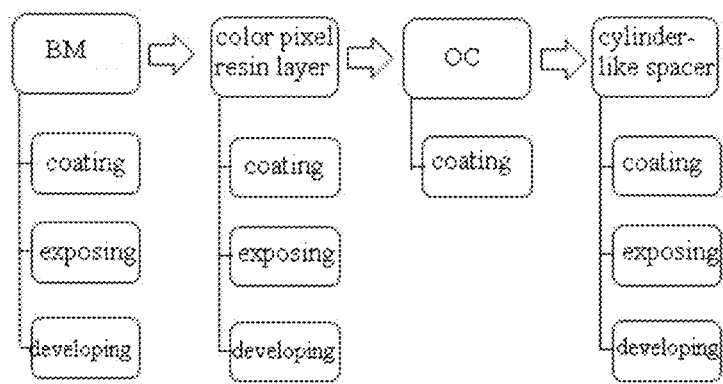
FIG. 7 is a flow chart of fabricating of a color filter substrate involved in an embodiment of the present disclosure.
Figure 8:
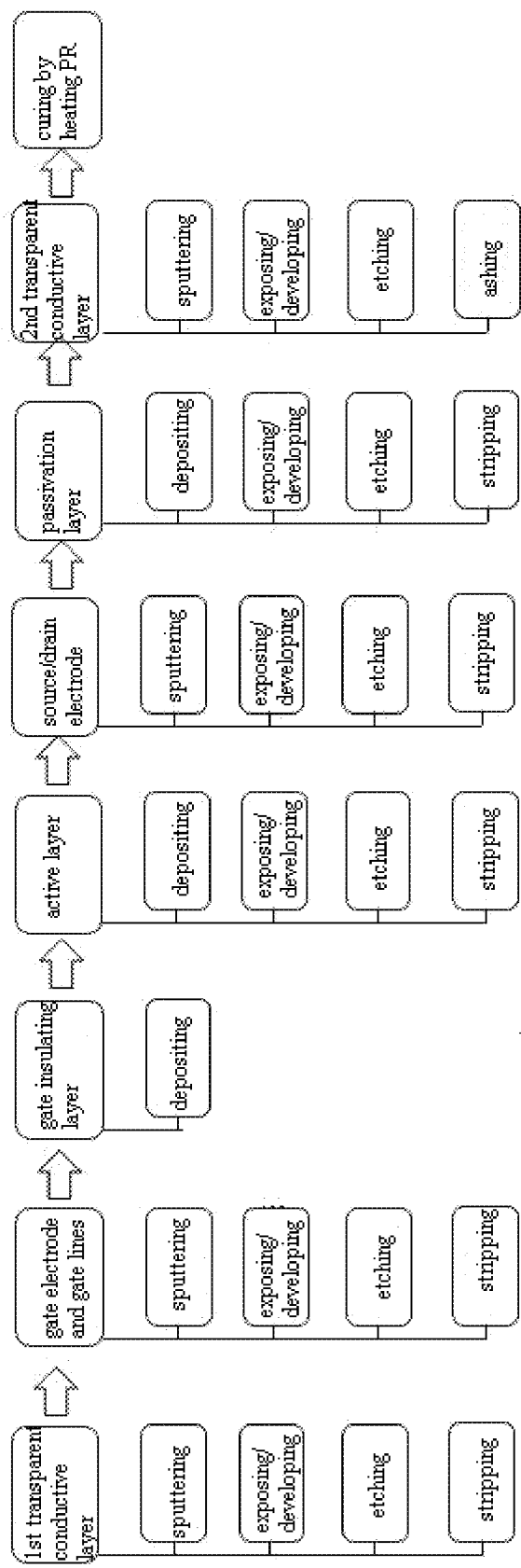
FIG. 8 is a flow chart of fabricating of an ADS array substrate in an embodiment of the present disclosure.

After being prepared, an opposite substrate (for example, a color filter substrate) and an array substrate are cell-assembled to obtain TFT-LCD liquid crystal display products. As shown in FIG. 7, the opposite substrate or the color filter substrate can be prepared in a usual manner, which is not described in detail herein. The method of fabricating an array substrate is introduced as follows. According to an embodiment of the present disclosure, as shown in FIG. 8, the method of fabricating the array substrate, including:

Step 1, depositing a transparent conductive layer with thickness of about 300~1000 Å on a substrate 13 by a sputtering process or thermal evaporation process, for example. Material of the transparent conductive material layer can be selected from a group consisting of, but is not limited to, ITO, IZO, or other metals and metal oxides. Then, a common electrode pattern is formed by processes of photoresist coating, exposure, development, wet etching and stripping.

Step 2, depositing a metal gate layer (Gate layer) on the substrate, which has been subjected to the step 1, by a process, such as sputtering, or thermal evaporation. The metal gate layer can be, for example, an aluminum film with a thickness of about 1000~5000 Å, or a Copper film may be used. But the embodiments of the present disclosure are not limited to these materials. Then, a pattern corresponding to the gate metal layer, such as gate electrodes and gate lines, is obtained by processes of photoresist coating, exposure, development, wet etching and stripping.

Step 3, forming films, such as a gate insulating layer, a semiconductor layer and an ohmic contact layer, on the substrate, which has been subjected to the above steps, by a process, such as Plasma Enhanced Chemical Vapor Deposition (PECVD). The film thickness of the gate insulating layer can be approximately 1000~4000 Å. Material for film of the gate insulating layer can be selected from a group of consisting of nitride SiNx or oxynitride SiOxNx, or a composite of the nitride SiNx and the oxynitride SiOxNx. The film thickness of the semiconductor layer can be about 1000~4000 Å, for example. The film thickness of Ohmic contact layer can be about 500~1000 Å, for example.

Then, a TFT channel of a pixel area is formed by processes of photoresist coating, exposure, development, dry etching and stripping.

Step 4, depositing a source-drain metal layer 19 with thickness of about 1000~5000 Å by a sputtering process, or a thermal evaporation process, for example, an aluminum film is deposited, or a copper film may be deposited. But the embodiments of the present disclosure are not limited to these materials. Then, source electrodes, a drain electrode and data scanning lines on the pixel area are obtained by processes including photoresist coating, exposure, development, and wet etching and stripping.

Step 5, depositing a passivation layer 20 with thickness of about 700~5000 Å on the array substrate that has been subjected to the step 4 by a process, such as Plasma Enhanced Chemical Vapor Deposition (PECVD), and forming via holes of the pixel area on the passivation layer 20. For example, a spacer block 26 can also be formed. Material of the passivation layer 20 can be selected from a group consisting of oxide, nitride or oxynitride.

Step 6, depositing a second transparent conductive layer 25 with thickness of about 300~1000 Å on the array substrate that has been subjected to the step 5 by processes, such as sputtering, or thermal evaporation. Material of the second transparent conductive layer 25 can be selected from a group consisting of ITO, IZO, or other metals or metal oxides. A pattern corresponding to the second transparent conductive layer is formed by a half-tone mask process (HTM, Half Tone Mask) or a single slit mask process (SSM, Single Slit Mask), which includes transparent pixel electrodes at the pixel area, a binding area (COF/IC bonding) connected with the transparent conductive layer, and photoresist retained on corresponding positions of the transparent protective layer in which the grooves correspond to spacers. Both of the half-tone mask process and the single slit mask process control light-sensitive thickness of photoresist by controlling luminous flux through the mask.

Figure 9:
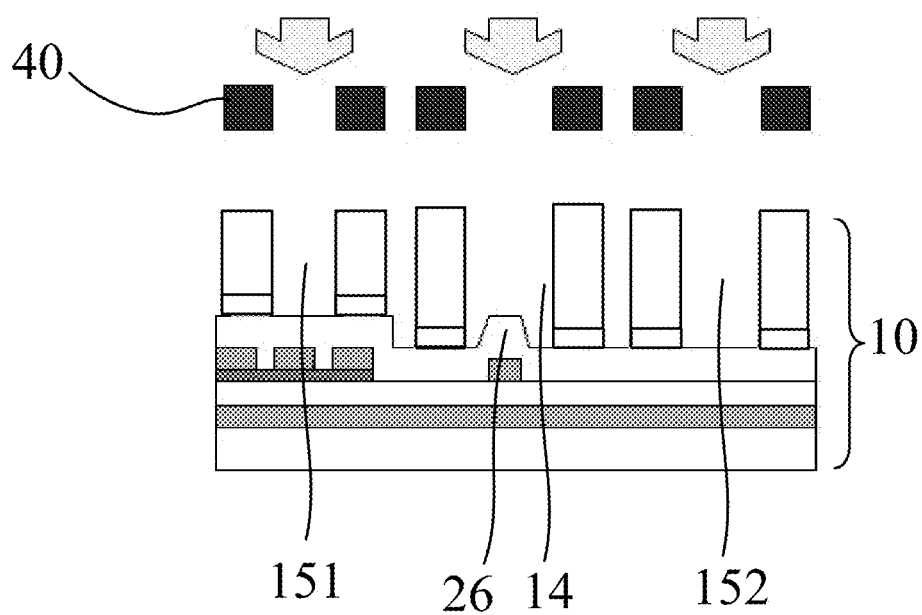
FIG. 9 is a schematic view of exposing process of a second transparent conductive layer in a fabrication procedure of an ADS array substrate in an embodiment of the present invention.

In the embodiment as shown in FIG. 9, a half-tone mask is used to perform exposure and development process to form a photoresist completely reserved area including an area that spacers correspond to grooves, a photoresist partially reserved area on areas corresponding to a COF/IC bonding area, a source-drain electrode and a second electrode at a pixel area, and a photoresist completely removal area on other areas or locations (not shown in the figures). For example, a wet etching is used to remove a transparent conductive layer on the photoresist completely removal area, and an ashing process is used to remove the photoresist on the photoresist partially reserved area and retain the corresponding transparent conductive layer, and grooves are formed via the retained photoresist on the positions that the spacers correspond thereto. Finally, an annealing process (Annealing) is performed to cure the retained photoresist. For example, the curing temperature is about 100~200° C., to allow the photoresist being degenerated and hardened to form the grooves. The height of the retained photoresist is about 1.0~2.0 μm, which is less than the thickness of the sealant (typically 2.0~4.0 μm) and the height of the spacers (about 2.0~3.5 μm). Therefore, cell-assembling will not be impacted while it can prevent mutual gliding between an array substrate and an opposite substrate. Optionally, the photoresist can be cured by employing an oxidizing process and ion bombarding process or the like. But the embodiments of the present disclosure are not limited to thereto.

The above process is achieved by using six exposure processes (6 mask process). In addition, five exposure processes (5 mask process) or four exposure processes (4 mask process) can be used to make the above array substrate.

For example, after depositing the transparent conductive layer in the step 1, depositing the gate metal layer by a sputtering process or a thermal evaporation process is followed, instead of an exposure and etching process. Subsequently, a half-tone mask process (HTM, Half Tone Mask) or a slit mask process can be used to form relevant patterns of common electrodes, gate electrodes and gate lines after multi-step of etching and stripping processes. Therefore, the exposure process can be reduced by one time and other processes can be the same.

For example, after performing the PECVD deposition of films of a gate insulating layer, a semiconductor layer and an ohmic contact layer in the step 3, sequentially depositing a source drain metal layer by a sputtering process or a thermal evaporating process is followed, instead of the exposure process and the etching process. Subsequently, a half-tone mask process (HTM, Half Tone Mask) or a slit mask process can be used, via multi-step of etching process and stripping process, to form the patterns that correspond to a gate insulating layer, a semiconductor layer, an ohmic contact layer and a source drain metal layer, such as TFT channel, source electrode, drain electrode, and data-scanning lines. Therefore, one exposure process is reduced and the remaining steps can be the same.

The described above is a method for designing and fabricating an ADS liquid crystal product. For a TN product, the main difference is that the common electrode is fabricated on a color filter substrate. For a HADS (High Advanced Domain Switch mode, HD ADS) product, for example, a common electrode layer is formed on top of an array substrate and a pixel electrode layer is formed on a source-drain metal layer, so that via hole structures are omitted. The design that grooves are formed via retained photoresist on positions corresponding to spacers can be used in both types of products and the fabrication methods are similar, which will not be described herein in detail.

However, for a TN product, the last photolithography process is the photolithography of an insulating material layer. The above grooves are formed by employing the photoresist in this process, and the formation of the grooves is similar to that of the grooves in the above-described ADS product, except that the etched film and patterns are different. Based on the above method for forming grooves of an ADS product, one of ordinary skill in the art can readily make simple modification to adapt a TN product process, which will not be described herein in detail.

It is to be understood that the above described is a description of the embodiments of the present disclosure, but it is not intended to limit the embodiments of the present disclosure. For example, the shape, size and position of a groove formed by the retaining photoresist above can be changed so as to form a groove, whose cross section is in a, for example, trapezoidal, rectangular, square, or circular shape. But the embodiments of the present disclosure are not limited thereto.

The embodiments of this present disclosure provide a display substrate, a fabricating method thereof and a display device. A groove that corresponds to a spacer is provided on the display substrate. After cell-assembling the display substrate and an opposite substrate, the spacer is placed in the groove, which can prevent a defective display caused by slippage between the two substrates. Moreover, the bottom surface of the groove exceeds the height of a pixel area on the display substrate. Therefore, even if the spacer slips out of the groove by strong external force, an alignment film will not be scratched, thus it can avoid partial abnormal alignment caused by the scratch. In addition, without additional steps, the groove can be formed synchronously by retaining photoresist used in the photolithography process of the display substrate on a preset position for the groove.

The described above are only illustrative implementations of the present disclosure, and the present disclosure is not intended to limited thereto. For one of ordinary skill in the art, various modifications and improvements can be made without departing from the principle and spirit of the present disclosure, and all of which shall fall within the scope of the present disclosure.

The present application claims the benefit of Chinese patent application No. 201510642296.1 filed on Sep. 30, 2015 and entitled "Display Substrate, Method of Fabricating the Same and Display Device," which is incorporated herein by reference entirely.

What is claimed is:

1. A display panel, comprising:
   a substrate;
   a first groove and a second groove formed on the substrate, wherein the first groove and the second groove are formed by photoresist and bottom surfaces of the grooves exceed a height of a pixel area on the substrate, and wherein a spacer block is provided in the bottom of the first groove;
   an opposite substrate; and
   a spacer structure formed on the opposite substrate corresponding to the grooves formed on the substrate, wherein the spacer structure comprises a main spacer received in the first groove with the spacer block therein and a secondary spacer received in the second groove, to allow the secondary spacer not to contact the substrate when the main spacer contacts the spacer block,
   wherein the second groove comprises a plurality of grooves with different heights.

2. The display panel according to claim 1, wherein the substrate is an array substrate, and wherein the first groove is provided on a distribution area of gate lines on the array substrate.

3. The display panel according to claim 1, wherein the substrate is an array substrate, and wherein the second groove is provided on a distribution area of gate lines and a corresponding area of a thin film transistor on the array substrate.

4. The display panel according to claim 1, wherein the main spacer has a height equal to that of the secondary spacer, and the first groove has a depth less than that of the second groove; or, the main spacer has a height greater than that of the secondary spacer, and the first groove has a depth equal to that of the second groove.

5. The display panel according to claim 1, wherein, when the spacer structure is placed in the grooves, a gap is provided between the spacer structure and a wall of the grooves.

6. The display panel according to claim 1, wherein the spacer structure is a columnar structure with a wide upper part and a narrow lower part, and each of the grooves that corresponds to the spacer structure is a structure with a wide upper part and a narrow lower part.

7. The display panel according to claim 1, wherein the photoresist comprises a photoresist used in a last photolithography process in a preparing process of the substrate.

8. The display panel according to claim 7, wherein the substrate is an array substrate, and wherein the grooves are provided above a top transparent conductive layer of the array substrate.

9. A display device, comprising a display panel, wherein the display panel comprises:
   a substrate;
   a first groove and a second groove formed on the substrate, wherein the first groove and the second groove are formed by photoresist and bottom surfaces of the grooves exceed a height of a pixel area on the substrate, and wherein a spacer block is provided in the bottom of the first groove;
   an opposite substrate; and
   a spacer structure formed on the opposite substrate corresponding to the grooves formed on the substrate, wherein the spacer structure comprises a main spacer received in the first groove with the spacer block therein and a secondary spacer received in the second groove, to allow the secondary spacer not to contact the substrate when the main spacer contacts the spacer block,
   wherein the second groove comprises a plurality of grooves with different heights.

10. The display device according to claim 9, wherein the substrate is an array substrate.

11. A method of fabricating a display panel, comprising:
    forming a first groove and a second groove on a substrate by photoresist used in a photolithography process, wherein bottom surfaces of the grooves exceed a height of a pixel area on the substrate;
    providing a spacer block in the first groove; and
    forming a spacer structure on an opposite substrate corresponding to the grooves formed on the substrate, wherein the spacer structure comprises a main spacer to be received in the first groove with the spacer block therein and a secondary spacer to be received in the second groove, to allow the secondary spacer not to contact the substrate when the main spacer contacts the spacer block.

12. The method of fabricating the display panel according to claim 11, further comprising:
    in a last photolithography process of the substrate, forming the grooves synchronously by the photoresist used in the photolithography process.

13. The method of fabricating the display panel according to claim 12, wherein the substrate is an array substrate, and in the last photolithography process of the array substrate for forming a transparent electrode, the grooves are formed synchronously by the photoresist via a half-tone mask process and an ashing process.

14. The method of fabricating the display panel according to claim 13, further comprising curing the grooves after the grooves are formed.

15. The method of fabricating the display panel according to claim 12, wherein the substrate is a color filter substrate and the grooves are provided above a top color filter layer.

* * * * *